United States Patent
Jung (10) Patent No.: US 7,514,200 B2
(45) Date of Patent: Apr. 7, 2009

(54) HARD MASK COMPOSITION FOR LITHOGRAPHY PROCESS

(75) Inventor: Jae Chang Jung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 279 days.

(21) Appl. No.: 11/633,167

(22) Filed: Dec. 4, 2006

(65) Prior Publication Data

US 2007/0154839 A1  Jul. 5, 2007

(30) Foreign Application Priority Data

Jan. 2, 2006  (KR) .................... 10-2006-0000218

(51) Int. Cl.
*G03C 1/73* (2006.01)
*G03F 7/20* (2006.01)
*G03F 7/30* (2006.01)
*G03F 7/36* (2006.01)

(52) U.S. Cl. .................... 430/270.1; 430/311; 430/313
(58) Field of Classification Search .................... None
See application file for complete search history.

(56) References Cited

U.S. PATENT DOCUMENTS 4,228,270 A * 10/1980 Kobayashi .................... 528/8
2003/0235784 A1 * 12/2003 Jung ...................... 430/271.1
2006/0003268 A1   1/2006 Hong et al. .................. 430/323
2007/0142617 A1   6/2007 Jung ........................... 528/310

FOREIGN PATENT DOCUMENTS

| JP | 2001-168191 | 6/2001 |
|----|-------------|--------|
| JP | 2001-215299 | 8/2001 |
| KR | 10-2005-0048258 | 5/2005 |
| KR | 2005-44501 | 5/2005 |
| KR | 10-2005-0084283 | 8/2005 |
| KR | 10-2005-0084638 | 8/2005 |

OTHER PUBLICATIONS

Korean Intellectual Property Office Notice of Rejection for Application No. 10-2006-0000218, dated Mar. 14, 2008.
Korean Patent Registration No. 1994-0079710, registered on Aug. 25, 1994 (Abstract Only).
Korean Intellectual Property Office Notice of Rejection for Application No. 10-2006-0000218, dated Dec. 14, 2007 (Abstract Only).

* cited by examiner

*Primary Examiner*—Sin J. Lee
(74) *Attorney, Agent, or Firm*—Marshall, Gerstein & Borun LLP (57) ABSTRACT

An inorganic hard mask composition, which is useful in the manufacture of semiconductor devices. When an underlying layer pattern of a semiconductor device is formed, an inorganic hard mask film having an excellent etching selectivity to an organic hard mask is further coated over an organic hard mask film and used as a hard mask, thereby facilitating etching of fine patterns.

9 Claims, 7 Drawing Sheets

HARD MASK COMPOSITION FOR LITHOGRAPHY PROCESS

BACKGROUND OF THE DISCLOSURE

1. Field of the Disclosure

The disclosure relates to a hard mask composition for a lithography process. More specifically, the disclosure relates to an inorganic hard mask composition, which are useful in processes for etching fine patterns of a semiconductor device.

2. Related Technology

In order to prevent collapse of fine patterns of less than 100 nm, preferably less than 80 nm, a photoresist film is required to have a thickness of less than 100 nm. However, because the thickness of less than 100 nm is not enough to survive an etching process of a lower layer, a new hard mask is required, such as an amorphous carbon film.

Amorphous carbon that has the properties of organic materials can be thickly coated and shows a sufficient selectivity when the lower layer is etched. As a result, amorphous carbon can be used as a hard mask for etching the thick lower layer even when the photoresist film is thinly formed. This is also caused by that a silicon oxide nitride film that serves as a different hard mask can be deposited over the hard mask formed of amorphous carbon because amorphous carbon can survive at high temperatures of over 400° C.

FIGS. 1a through 1e are cross-sectional diagrams illustrating a conventional method for forming an underlying layer pattern of a semiconductor device using the above-described amorphous carbon film as a hard mask.

Figure 1A:
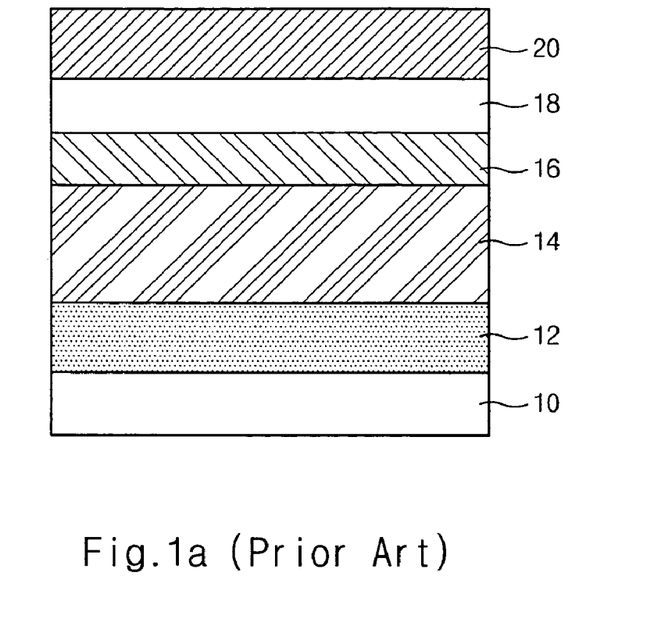
FIGS. 1a through 1e are cross-sectional diagrams illustrating a conventional method for forming an underlying layer pattern of a semiconductor device.

Referring to FIG. 1a, an underlying layer 12, an amorphous carbon film 14, a silicon oxide nitride film 16, an anti-reflective coating (hereinafter abbreviated to "ARC") film 18 and a photoresist film 20 are sequentially formed on a semiconductor substrate 10. The amorphous carbon film 14 is typically formed at a thickness ranging from 100 nm to 800 nm by chemical vapor deposition equipment. The photoresist film 20 is typically formed at a thickness ranging from 40 nm to 200 nm.

Figure 1B:
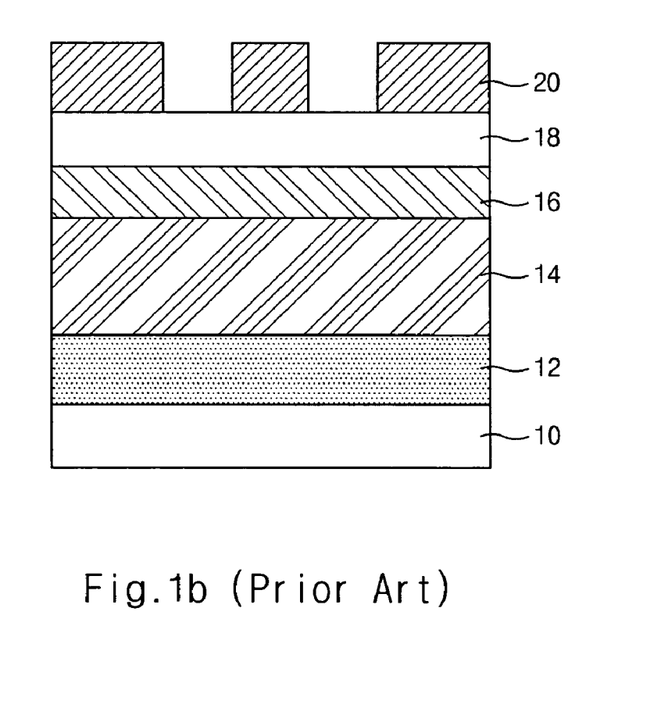

Referring to FIG. 1b, the photoresist film 20 is selectively exposed and developed to form a pattern of the photoresist film 20.

Figure 1C:
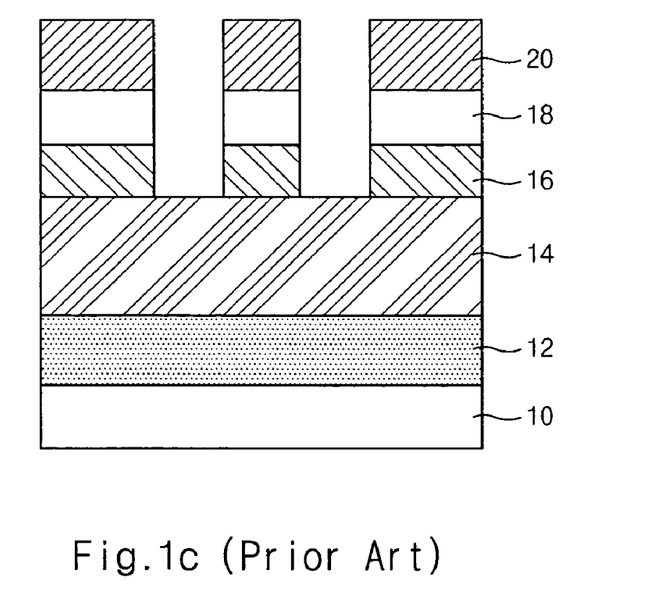

Referring to FIG. 1c, a common etching process is performed to remove sequentially the lower ARC film 18 and the silicon oxide nitride film 16 with the pattern of the photoresist film 20 as an etching mask, thereby forming a pattern of the ARC film 18 and a pattern of the silicon oxide nitride film 16.

Figure 1D:
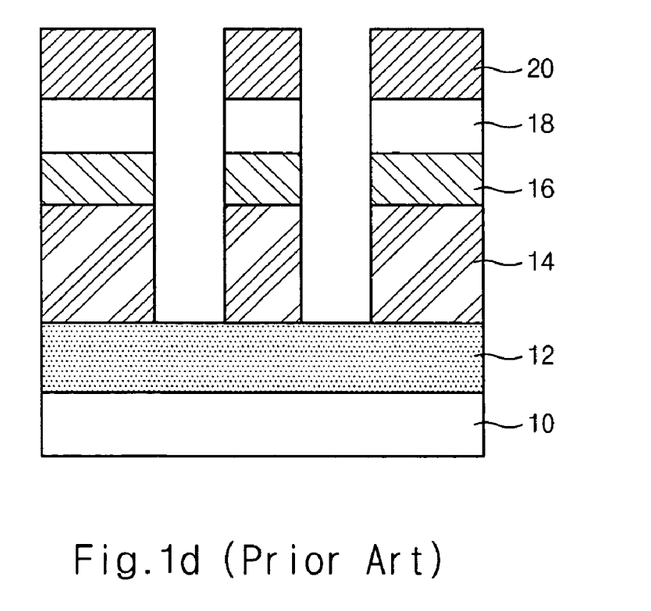

Referring to FIG. 1d, a common etching process is performed to remove the lower amorphous carbon film 14 with the pattern of the photoresist film 20, the pattern of the ARC film 18 and the pattern of the silicon oxide nitride film 16 which remain after the above etching process, thereby forming a pattern of the amorphous carbon film 14.

Figure 1E:
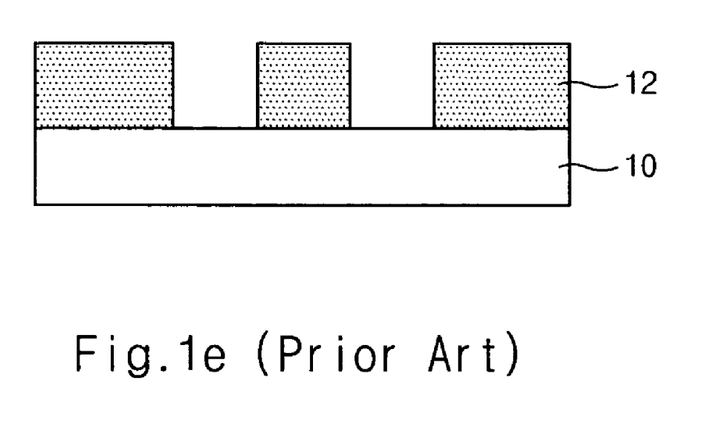

Referring to FIG. 1e, the lower underlying layer 12 is etched with the pattern of the amorphous carbon film 14 and the residual patterns after the above process to form a pattern of the underlying layer 12. Then, the residual patterns used as etching masks are removed by cleaning.

As noted above, the additional chemical vapor deposition equipment and a chemical vapor deposition gas have been conventionally required to deposit the amorphous carbon film 14 when the pattern of the underlying layer 12 is formed so that high cost is needed.

As a material for forming a hard mask used for etching fine patterns of semiconductor device, an organic polymer having a strong heat resistance can be used instead of the amorphous carbon. And an inorganic hard mask film having an excellent etching selectivity has been required which is formed over the organic hard mask film.

SUMMARY OF THE DISCLOSURE

Disclosed herein is a hard mask composition for forming an inorganic hard mask film having an excellent etching selectivity over an organic hard mask film useful in processes for etching fine patterns of a semiconductor device. Also disclosed herein is a method for manufacturing a semiconductor which comprises forming an underlying layer pattern with a hard mask formed using the hard mask composition.

BRIEF DESCRIPTION OF THE DRAWINGS

For a more complete understanding of the invention, reference should be made to the following detailed description and accompanying drawings wherein.

DETAILED DESCRIPTION OF PREFERRED EMBODIMENTS

Disclosed herein is a hard mask composition that comprises poly(borodiphenylsiloxane) used as a hard mask in an etching process for forming an underlying layer pattern of a semiconductor device. Also, disclosed herein is a method for forming an underlying layer pattern using the same.

An inorganic hard mask composition comprises poly(borodiphenylsiloxane), polyvinylphenol, a cross-linking agent, a thermal acid generator, and an organic solvent.

The poly(borodiphenylsiloxane) includes boron (B), thereby securing a high etching selectivity to an organic hard mask under a common dry etching condition using a mixture gas including oxygen and nitrogen. When the organic hard mask film is etched with the disclosed inorganic hard mask film as an etching mask under the common dry etching condition using a mixture gas including oxygen and nitrogen, the etching selectivity is about inorganic hard mask film: organic hard mask film=1:90~100.

The polyvinylphenol is preferably present in an amount ranging from 10 to 60 parts by weight based on 100 parts by weight of the poly(borodiphenylsiloxane).

The cross-linking agent is preferably a melamine derivative, and the melamine derivative is preferably 2,4,6-tris(dimethoxymethylamino)-1,3,5-triazine of the following Formula 1.

[Formula 1]

The cross-linking agent is present in an amount which can cause cross-linking between poly(borodiphenylsiloxane) and polyvinylphenol, or poly(borodiphenylsiloxane) and polyvi- nylphenol themselves. For example, the cross-linking agent is preferably present in an amount ranging from 1 to 10 parts by weight, based on 100 parts by weight of the poly(borodiphenylsiloxane). The cross-linking reaction occurs only slightly when the cross-linking agent is present in the amount of less than 1 part by weight, and the etching resistance is reduced when the cross-linking agent is present in the amount of over 10 parts by weight, all based on 100 parts by weight to poly(borodiphenylsiloxane).

Any suitable thermal acid generator can be used. Preferably, the thermal acid generator is selected from the group consisting of 2-hydroxyhexyl p-toluenesulfonate, 2,4,4,6-tetrabromocyclohexadienone, 2-nitrobenzyl p-toluenesulfonate, benzoin p-toluenesulfonate and mixtures thereof. The thermal acid generator is preferably present in an amount ranging from 1 to 10 parts by weight based on 100 parts by weight of the poly(borodiphenylsiloxane).

The organic solvent is preferably selected from the group consisting of cyclohexanone, cyclopentanone, γ-butyrolactone, and mixtures thereof. Preferably, the organic solvent is present in an amount ranging from 200 to 5000 parts by weight, based on 100 parts by weight of the poly(borodiphenylsiloxane). The coating property is degraded and the coating does not maintain uniform thickness when an organic solvent is present in an amount of less than 200 parts by weight. The organic solvent is too thinly coated to serve as a hard mask when the organic solvent is present in the amount of over 5000 parts by weight, all based on 100 parts by weight of poly(borodiphenylsiloxane).

Also disclosed herein is a method for manufacturing a semiconductor device. The method comprises: forming an underlying layer over a semiconductor substrate; forming a stack structure pattern of a first hard mask, a second hard mask, and photoresist layer; and patterning the underlying layer using the stack structure pattern as an etching mask, wherein said first hard mask is formed of an organic film and said second hard mask is formed of the disclosed inorganic hard mask composition.

The organic hard mask film comprises an organic polymer preferably polyamic acid of Formula 2:

In the above-described process, the underlying layer includes an oxide film, a nitride film, an oxide nitride film, or a polysilicon layer.

In the above-described process, the organic hard mask film and the inorganic hard mask film preferably are each formed to have a thickness ranging from 30 nm to 1000 nm, and the photoresist film is preferably formed to have a thickness ranging from 30 nm to 300 nm.

Before the photoresist layer is formed, an organic anti-reflection film is formed over the inorganic hard mask film, and a photoresist film can be formed thereover.

Hereinafter, the disclosed method for manufacturing a semiconductor device is explained with reference to the accompanying drawings.

FIGS. 2a through 2e are cross-sectional diagrams illustrating a disclosed method for forming an underlying layer pattern of a semiconductor device, that is, a method for forming an underlying layer pattern with the above-described inorganic hard mask film.

Figure 2A:
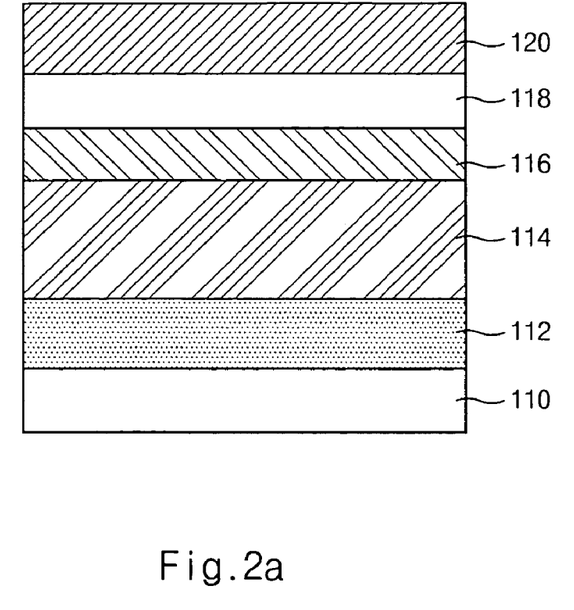
FIGS. 2a through 2e are cross-sectional diagrams illustrating a disclosed method for forming an underlying layer pattern of a semiconductor device.

Referring to FIG. 2a, an underlying layer 112, a polyamic acid film 114 as an organic hard mask, a disclosed inorganic hard mask film 116, an anti-reflection film 118 and a photoresist film 120 are sequentially formed over a semiconductor substrate 110.

A spin-coating process is performed to coat a hard mask composition comprising the polyamic acid of Formula 2, a cross-linking agent and an organic solvent, thereby obtaining the organic hard mask film 114 at a thickness preferably ranging from 30 nm to 1000 nm. The organic solvent is preferably present in an amount ranging from 20 to 5000 parts by weight based on 100 parts by weight of the polyamic acid, and the cross-linking agent is preferably present in an amount ranging from 1 to 10 parts by weight based on 100 parts by weight of the polyamic acid.

The spin-coating process is performed to coat the disclosed hard mask composition, thereby obtaining the inorganic hard mask film 116 preferably at a thickness preferably ranging from 30 nm to 1000 nm. The photoresist film 120 is preferably formed at a thickness ranging from 30 nm to 300 nm.

Generally, a baking process is performed to harden the films. Since the disclosed hard mask composition comprises a thermal acid generator and a cross-linking agent, the acid generated from the thermal acid generator during the baking process serves as a catalyst so that polymers included in the composition are crosslinked not to be dissolved in other films.

Meanwhile, any of organic anti-reflection films and photoresist materials can be used depending on process conditions such as light sources. The underlying layer includes an oxide film, a nitride film, an oxide nitride film, or a polysilicon layer.

Figure 2B:
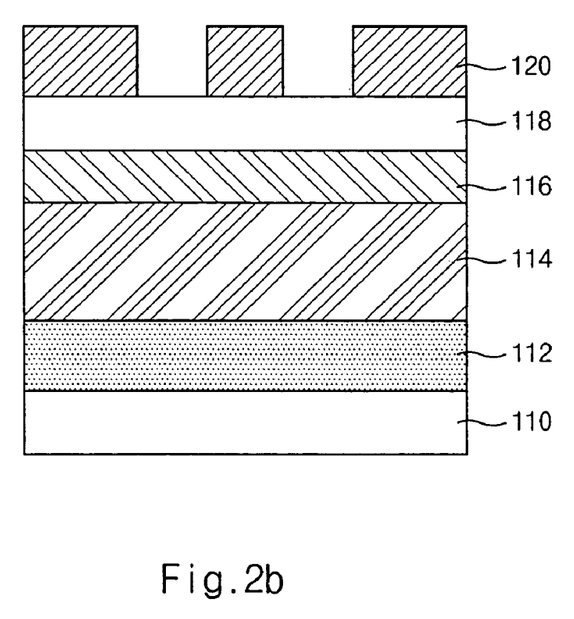

Referring to FIG. 2b, the photoresist film 120 is selectively exposed and developed to form a pattern of the photoresist film 120.

Figure 2C:
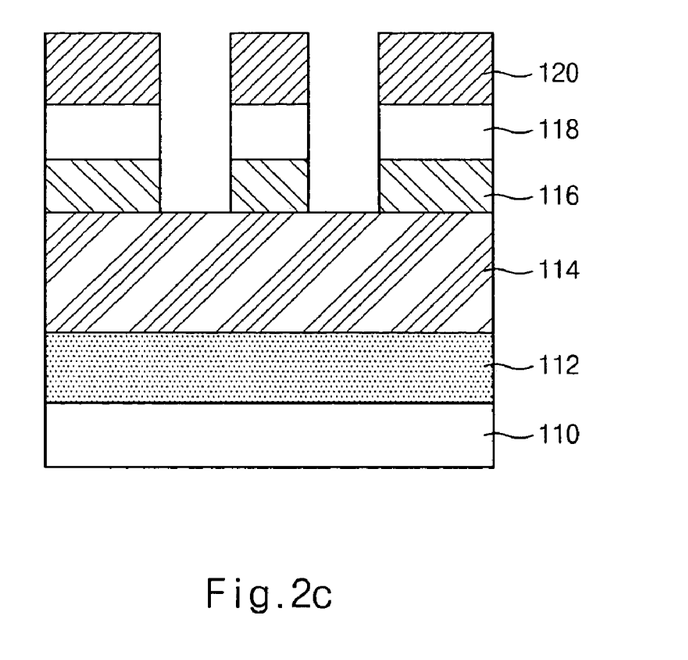

Referring to FIG. 2c, a dry etching process is performed to remove sequentially the lower ARC film 118 and the inorganic hard mask film 116 with the pattern of the photoresist film 120 as an etching mask, thereby forming a pattern of the ARC film 118 and a pattern of the inorganic hard mask film 116.

Figure 2D:
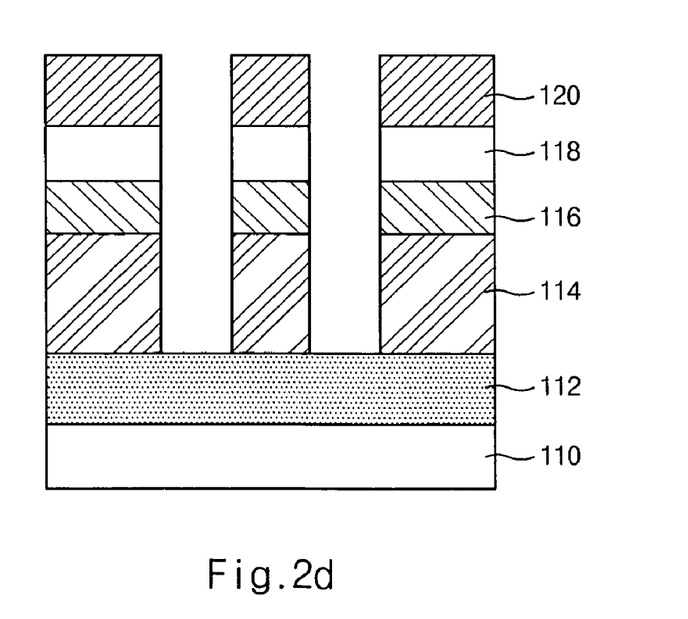

Referring to FIG. 2d, the dry etching process is performed to remove the lower organic hard mask film 114 with the patterns of the photoresist film 120, the pattern of the ARC film 118 and the pattern of the inorganic hard mask film 116 which remains after the above etching process, thereby forming a pattern of the organic hard mask film 114.

Figure 2E:
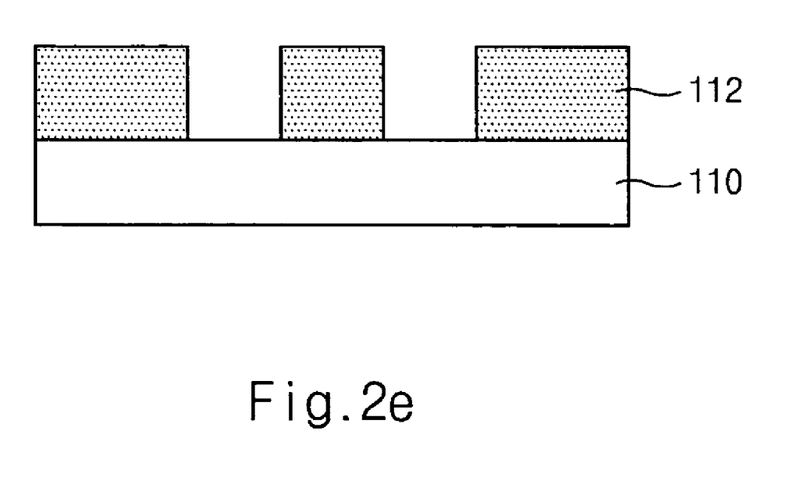

Referring to FIG. 2e, the lower underlying layer 112 is etched with the pattern of the organic hard mask film 114 and the residual patterns after the above process to form a pattern of the underlying layer 112 preferably at a thickness ranging from 30 nm to 200 nm. Then, the residual patterns used as etching masks are removed.

When the ARC film and the inorganic hard mask film 116 are etched with the photoresist film 120 during the etching processes of FIGS. 2c through 2e, the etching process is preferably performed with an etching gas of $CF_4$ (supply flow: 90 sccm)+$O_2$ (supply flow: 10 sccm). When the organic hard mask film 114 is etched with the inorganic hard mask film 116, the etching process is preferably performed with an etching gas of $N_2$ (supply flow: 90 sccm)+$O_2$ (supply flow: 10 sccm). When the lower underlying layer is etched with the organic hard mask film 114, the etching process is preferably performed with a mixture gas of $CHF_3$ (supply flow: 60 sccm)+$CF_4$ (supply flow: 35 sccm)+$O_2$ (supply flow: 2 sccm)+Ar (supply flow: 3 sccm).

The power may have a various range depending on kinds of etching equipments, used gases or processes. However, the source RF power preferably ranges 300 W to 1000 W, and the bias power preferably ranges 0 to 300 W.

As described above, the simple spin-coating process is performed to form the organic hard mask film 114. Then, the inorganic hard mask film 116 is deposited using the disclosed hard mask composition having a high etching selectivity to the organic polymer over the organic hard mask film 114, thereby obtaining the disclosed pattern of the underlying layer 112. As a result, it is easy to etch the patterns of the lower layers.

EXAMPLES

The disclosed compositions will be described in detail by referring to examples below, which are not intended to limit the scope of the disclosure.

Preparation Example 1

Preparation of an Organic Hard Mask Composition

To cyclohexanone (70 g) were dissolved the polyamic acid (10 g) of Formula 2 and the 2,4,6-tris(dimethoxymethylamino)-1,3,5-triazine (0.6 g) of Formula 1, thereby obtaining an organic hard mask composition.

Preparation Example 2

Preparation of a Disclosed Inorganic Hard Mask Composition

To cyclohexanone (200 g) were dissolved poly(borodiphenylsiloxane) (10 g) (CAS No.: 70914-15-7), polyvinylphenol (2 g) (molecular weight: 8000), the 2,4,6-tris(dimethoxymethylamino)-1,3,5-triazine (0.6 g) of Formula 1 and 2-hydroxyhexyl p-toluenesulfonate (1 g), thereby obtaining a disclosed inorganic hard mask composition.

Example 1

Formation of a Hard Mask Film and a Lower Layer Pattern

A silicon oxide film was formed at a thickness of 350 nm over a silicon wafer, and then a silicon nitride film was formed at a thickness of 100 nm thereover. A spin-coating process was performed to coat the organic hard mask composition obtained from Preparation Example 1 over the nitride film. After coating, the resulting structure was baked at 200° C. for 2 minutes and then at 400° C. for 2 minutes to form a polyamic acid film of 400 nm.

The spin-coating process was performed to coat the inorganic hard mask composition obtained from Preparation Example 2 over the organic hard mask film. Then, the resulting structure was baked at 200° C. for 2 minutes, thereby forming an inorganic hard mask film of 100 nm.

An ARC film composition (DAR202 BARC produced by Dongjin SemiChem) was coated over the inorganic hard mask film, thereby forming an ARC film.

A photoresist material (AR1221J produced by JSR co.) was coated over the ARC film, and baked at 130° C. for 90 seconds to form a photoresist film of 200 nm. Then, the resulting structure was exposed by an ArF exposer, and post-baked at 130° C. for 90 seconds. After baking, the resulting structure was developed with 2.38 wt % TMAH aqueous solution to form an 80 nm photoresist pattern.

Thereafter, the lower ARC film and the inorganic hard mask film are selectively etched with the photoresist pattern as an etching mask to form patterns of the ARC film and the inorganic hard mask film (etching condition: $90CF_4+10O_2$, source RF power: about 700 W, bias power: about 150 W). Also, the polyamic acid film which was the lower organic hard mask film was selectively etched with the above patterns as etching masks to form a pattern of the polyamic acid film (etching condition: $10O_2+90N_2$, source RF power: about 700 W, bias power: about 150 W). Next, the lower silicon nitride film and the silicon oxide film were etched with the above patterns including the polyamic acid film pattern as an etching mask to form a 80 nm pattern (etching condition: $60CHF_3+35CF_4+2O_2+3Ar$, source RF power: about 700 W, bias power: about 150 W).

When the organic hard mask film was etched with the disclosed inorganic hard mask film, the etching selectivity was shown to be inorganic hard mask film: organic hard mask film=1:100. As a result, the hard mask film using the disclosed inorganic hard mask composition was shown to have a high etching selectivity to the organic hard mask.

Figure 3:
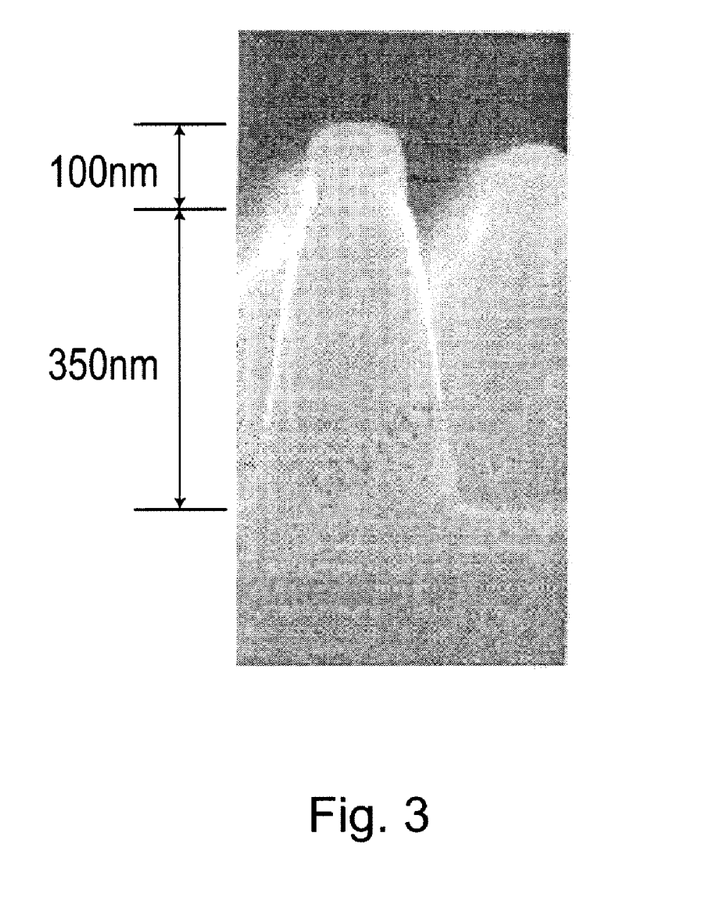
FIG. 3 is a cross-sectional SEM photograph illustrating an underlying layer pattern obtained from Example 1.

FIG. 3 shows a cross-sectional SEM photograph of the silicon oxide film (thickness: 350 nm) and the silicon nitride film (thickness: 100 nm) which remain after the above patterns including the polyamic acid pattern are removed.

As described above, an inorganic hard mask film having an excellent etching selectivity to an organic hard mask is further coated over an organic hard mask film and used as a hard mask, thereby facilitating etching of fine patterns.

What is claimed is:

1. A hard mask composition comprising: poly(borodiphenylsiloxane), polyvinylphenol, a cross-linking agent, a thermal acid generator, and an organic solvent.

2. The hard mask composition according to claim 1, wherein the cross-linking agent is a melamine derivative, and the organic solvent is selected from the group consisting of cyclohexanone, cyclopentanone, γ-butyrolactone, and mixtures thereof.

3. The hard mask composition according to claim 2, wherein the cross-linking agent is 2,4,6-tris(dimethoxymethylamino)-1,3,5-triazine represented by Formula 1:

[Formula 1]

4. The hard mask composition according to claim 1, wherein the thermal acid generator is selected from the group consisting of 2-hydroxyhexyl p-toluenesulfonate, 2,4,4,6-tetrabromocyclohexadienone, 2-nitrobenzyl p-toluenesulfonate, benzoin p-toluenesulfonate and mixtures thereof.

5. The hard mask composition according to claim 1, wherein the polyvinylphenol is present in an amount ranging from 10 to 60 parts by weight based on 100 parts by weight of the poly(borodiphenylsiloxane), the organic solvent is present in an amount ranging from 200 to 5000 parts by weight based on 100 parts by weight of the poly(borodiphenylsiloxane), and the cross-linking agent and the thermal acid generator are independently present in an amount ranging from 1 to 10 parts by weight based on 100 parts by weight of the poly(borodiphenylsiloxane).

6. A method for manufacturing a semiconductor device comprising:

forming an underlying layer over a semiconductor substrate;

forming a stack structure pattern of a first hard mask, a second hard mask, and a photoresist layer; and patterning the underlying layer using the stack structure pattern as an etching mask, wherein said first hard mask is formed of an organic film and said second hard mask is formed of a hard mask composition of claim 1.

7. The method according to claim 6, wherein the organic hard mask film comprises a polyamic acid represented by Formula 2:

[Formula 2]

8. The method according to claim 6, comprising independently forming the first hard mask film and the second hard mask film at a thickness ranging from 30 nm to 1000 nm, and forming the photoresist film at a thickness ranging from 30 nm to 300 nm.

9. The method according to claim 6, further comprising forming an anti-reflection film over the second hard mask film before forming the photoresist layer.

* * * * *